United States Patent
Kwak (10) Patent No.: US 8,040,736 B2
(45) Date of Patent: Oct. 18, 2011

(54) NON-VOLATILE MEMORY DEVICE, COMPUTING SYSTEM AND WORDLINE DRIVING METHOD

(75) Inventor: Joon Young Kwak, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 261 days.

(21) Appl. No.: 12/433,685

(22) Filed: Apr. 30, 2009

(65) Prior Publication Data

US 2009/0296490 A1 Dec. 3, 2009

(30) Foreign Application Priority Data

May 28, 2008 (KR) .................. 10-2008-0049773

(51) Int. Cl.
*G11C 16/06* (2006.01)
(52) U.S. Cl. ......... 365/185.23; 365/185.25; 365/185.18; 365/189.09
(58) Field of Classification Search ............. 365/185.23, 365/185.25, 185.18, 189.09
See application file for complete search history.

(56) References Cited

U.S. PATENT DOCUMENTS

| 7,692,977 B2 * | 4/2010 | Kim et al. ............... 365/189.09 |
| 2007/0140036 A1 * | 6/2007 | Noguchi et al. ......... 365/230.03 |

FOREIGN PATENT DOCUMENTS

| JP | 10-201222 | 7/1998 |
| KR | 10-2006-0030652 | 4/2006 |
| KR | 10-2006-0034994 | 4/2006 |
| KR | 10-2007-0054008 | 5/2007 |

OTHER PUBLICATIONS

English language abstract of Japanese Publication No. 10-201222.
English language abstract of Korean Publication No. 10-2006-0030652.
English language abstract of Korean Publication No. 10-2006-0034994.
English language abstract of Korean Publication No. 10-2007-0054008.

* cited by examiner

*Primary Examiner* — Tuan Nguyen
*Assistant Examiner* — Toan Le
(74) *Attorney, Agent, or Firm* — Myers Bigel Sibley & Sajovec, P.A.

(57) ABSTRACT

A nonvolatile memory device including a memory cell; a word line coupled to the memory cell; a drive line; a switch coupled between the word line and the drive line, and configured to electrically connect the word line and the drive line; and a voltage generator coupled to the drive line and configured to charge the drive line to a precharge voltage. The precharge voltage is higher than a bias voltage applied to the word line during a corresponding operation on the memory cell.

18 Claims, 6 Drawing Sheets

NON-VOLATILE MEMORY DEVICE, COMPUTING SYSTEM AND WORDLINE DRIVING METHOD

CROSS-REFERENCE TO RELATED APPLICATIONS

This application claims priority under 35 U.S.C §119 to Korean Patent Application No. 2008-49773, filed on May 28, 2008, in the Korean Intellectual Property Office, the entire contents of which are incorporated by reference.

BACKGROUND

This disclosure relates to semiconductor devices and, more particularly, to nonvolatile memory devices and methods of driving word lines.

A nonvolatile memory device can include floating gate transistors as memory cells. A variety of voltages are applied to the gates of the floating gate transistors during operation of the memory device. The time taken applying these voltages to the gates of the floating gate transistors can affect the time of an operation of the memory device.

SUMMARY

An embodiment includes a nonvolatile memory device including a memory cell; a word line coupled to the memory cell; a drive line; a switch coupled between the word line and the drive line, and configured to electrically connect the word line and the drive line; and a voltage generator coupled to the drive line and configured to charge the drive line to a precharge voltage. The precharge voltage is higher than a bias voltage applied to the word line during a corresponding operation on the memory cell.

Another embodiment includes a method of driving a word line of a nonvolatile memory device including charging a drive line to a precharge voltage; electrically connecting the drive line to a word line coupled to a memory cell after charging the drive line to the precharge voltage; and charging the word line to a bias voltage for an operation of the memory cell. The bias voltage is less than the precharge voltage.

DETAILED DESCRIPTION

Embodiments will now be described more fully hereinafter with reference to the accompanying drawings. Embodiments, however, may take many different forms and should not be construed as limited to the particular embodiments set forth herein. Rather, these embodiments are provided so that this disclosure will be thorough and complete, and will fully convey the scope of the following claims. In the drawings, the thicknesses of layers and regions are exaggerated for clarity. Like numbers refer to like elements throughout the accompanying figures.

Figure 1:
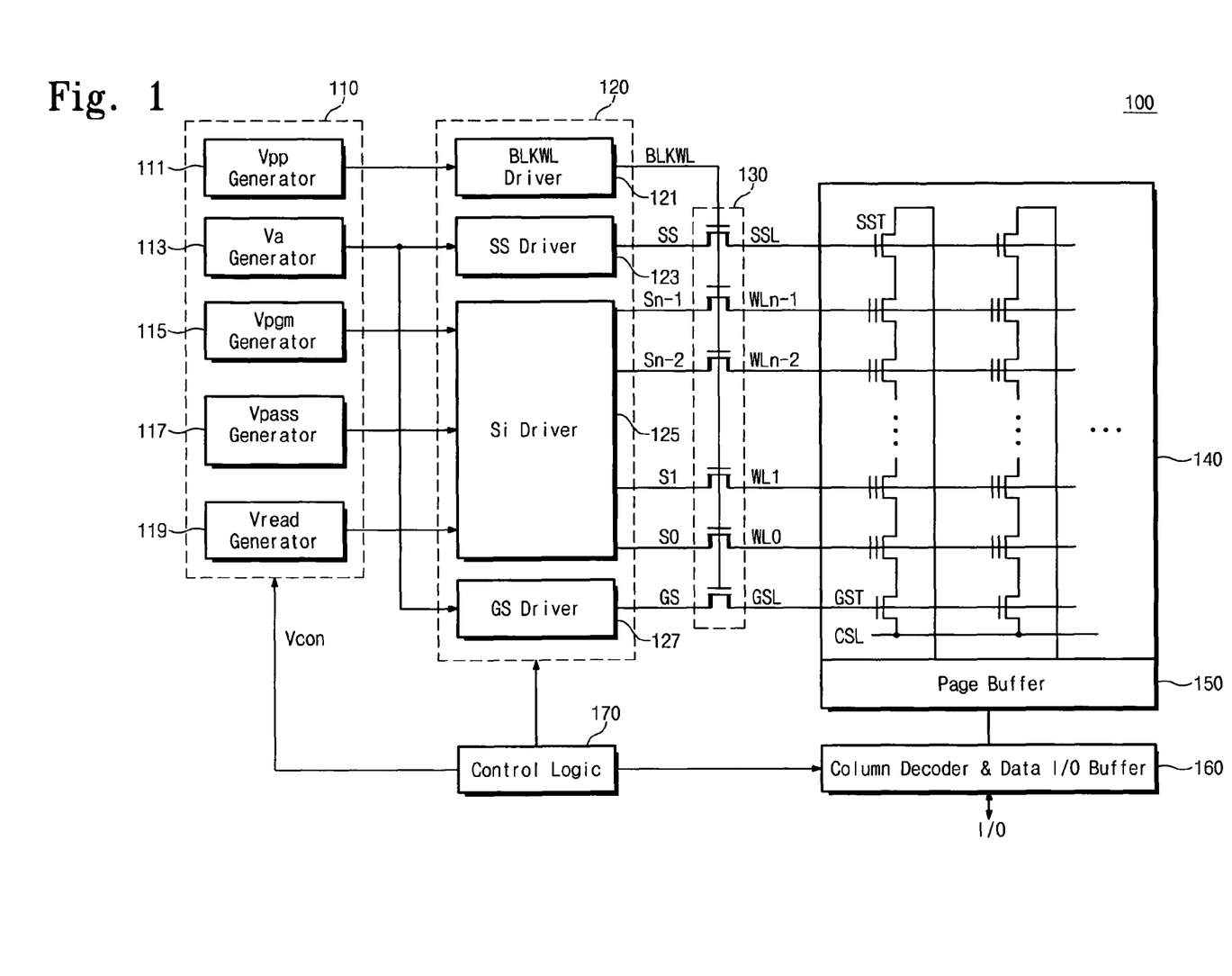
FIG. 1 is a block diagram illustrating a structure of a flash memory device according to an embodiment.

FIG. 1 is a block diagram illustrating a structure of a flash memory device according to an embodiment. Referring to FIG. 1, in the embodiment a flash memory device includes a high-voltage generator unit 110, a driver circuit unit 120, a pass gate 130, a memory cell array 140, a page buffer 150, a column decoder and data input/output buffer 160, and a control logic 170.

The high-voltage generator unit 110 is configured to generate internal high-voltages used in the flash memory device. For example, a power voltage Vcc provided from an external source may not have a voltage level sufficient for controlling high-voltage switches or high voltages needed for program, erase, and verify operations of the memory devices. A high-voltage pump circuit can be configured to boost the power voltage Vcc to a high voltage level sufficient to perform one or more of the above operations. In an embodiment, multiple high-voltage pump circuits can be provided corresponding to the number of high voltages used. Alternatively, one high voltage pump circuit can generate multiple high voltages. Here, only the high-voltage pump circuits used in program and read operations are illustrated, however, embodiments are not limited to this.

The high-voltage generator unit 110 is configured to operate according to control of the control logic 170. The high-voltage generator unit 110 includes a Vpp generator 111, a select voltage generator 113, a program voltage generator 115, a pass voltage generator 117, and a read voltage generator 119. The Vpp generator 111 is configured to generate a high-voltage supplied to a block select driver 121. The select voltage generator 113 is configured to generate string select and ground select voltages SS and GS to be supplied to a string select line SSL and a ground select line GSL, respectively. The program voltage generator 115 is configured to generate a program voltage Vpgm to be supplied to a selected word line, during a program operation. In an embodiment, the program voltage generator 115 can be configured to generate a step voltage according to an incremental step pulse programming (ISPP) method. In a flash memory device, program loops can be repeated until the programming is completed. The program voltage is increased by a predetermined step as the program loops are repeated. The pass voltage generator 117 is configured to generate a pass voltage Vpass to be supplied to the unselected word lines during a program operation. The read voltage generator 119 is configured to generate a read voltage Vread to be supplied to the unselected word lines during a read operation.

The driver circuit unit 120 is configured to supply the voltages input from the high-voltage generator unit 110 to a block region of the memory cell array 140, in response to a page address. In an embodiment, the page address includes row address information of the selected word line. The driver circuit unit 120 includes a block select driver 121, a string select driver 123, a word line driver 125, and a ground select driver 127.

The block select driver 121 is configured to supply a high-voltage Vpp from the Vpp generator 111 to a pass gate 130 in response to a block address. In particular, the block select driver 121 is configured to supply a block select signal BLKWL to control gates of multiple high-voltage switches included in the pass gate 130. The block select driver 121 is able to control the application of various voltages such as the pass voltage Vpass, the program voltage Vpgm, the read voltage Vread or the like to the memory cell array 140.

The string select driver 123 is configured to supply a voltage provided from the select voltage generator 113 as the string select signal. During a program operation, the string select driver 123 is configured to supply a select voltage so as to turn on all string select transistors SST in a selected block.

During a program operation, the word line driver 125 is configured to supply voltages provided from the program voltage generator 115, pass voltage generator 117 and read voltage generator 119 to the respective selected word line and unselected word lines. The pass voltage Vpass is provided to all of the word lines to perform a program operation in a general program loop. A program voltage Vpgm that is higher than the pass voltage Vpass is supplied to the selected word line. In an embodiment, the program voltage can be increased in a predetermined step, and supplied to the selected word line. Whether this is performed may be determined according to whether a verification operation performed in a program verify interval is passed. The ground select driver 127 is configured to supply a ground select signal GS.

The pass gate 130 is configured so that the string select line SSL, ground select line GSL, and word lines WLi are electrically connected to drive lines, in response to activation of the block select signal BLKWL. In an embodiment, the pass gate 130 includes multiple switch transistors. The gates of the switch transistors are each configured to receive a block select signal BLKWL output from the block select driver 121. When the block select signal BLKWL is activated, the string select line SSL, ground select line GSL and word lines WLi are electrically connected to the drive lines respectively via corresponding switch transistors. In an embodiment, the switch transistors can include high-voltage transistors capable of enduring high-voltage.

The memory cell array 140 includes multiple memory blocks. The memory cell array 140 illustrated in FIG. 1 only includes a memory block, however embodiments are not limited to only one memory block. The respective memory blocks include multiple strings. Each of the strings includes a string select transistor SST, a ground select transistor GST, and multiple memory cells connected in series between a source of the string select transistor SST and a drain of the ground select transistor GST. In each string, the drain of the string select transistor SST is electrically connected to a corresponding bit line, and the source of the ground select transistor GST is electrically connected to a common source line CSL. The gates of the string select transistors SST among a memory block of the memory cell array 140 are connected in common to the string select line SSL. The gates of the ground select transistors GST among the memory block of the memory cell array 140 are connected in common to the ground select line GSL. Control gates of the memory cells included in each string are connected to the corresponding word lines, respectively. Bit lines are electrically connected to the page buffer 150.

In an embodiment, the page buffer 150 is configured to operate as a sense amplifier or a write driver according to a mode of operation. For example, the page buffer 150 is configured to operate as a sense amplifier during a read operation and as a write driver during a program operation. During a read operation, the page buffer 150 is configured to sense data bits from the memory cells of the selected word line, and output the sensed data bits externally via a column decoder and data input/output buffer 160. During a program operation, the page buffer 150 is configured to temporarily store the program data transferred via the column decoder and data input/output buffer 160, and drive the bit lines to the bit line bias voltages according to the stored program data. Although not shown in drawings, in an embodiment, memory cells coupled in common to a word line can constitute one page. The page buffer can include multiple page buffers corresponding to the bit lines.

The column decoder and data input/output buffer 160 is configured to transfer the sensed data from the page buffer 150 to an external device, and/or transfer the input data inputted from an external source to the page buffer 150.

The control logic 170 is configured to control the high-voltage generator unit 110 and the driver circuit unit 120 so as to supply the word line voltages and the select signal line voltages to the memory cell array 140, during a program operation. In particular, the control logic 170 controls the level of the pass voltage Vpass outputted from the pass voltage generator 117 via a voltage control signal Vcon.

Figure 2:
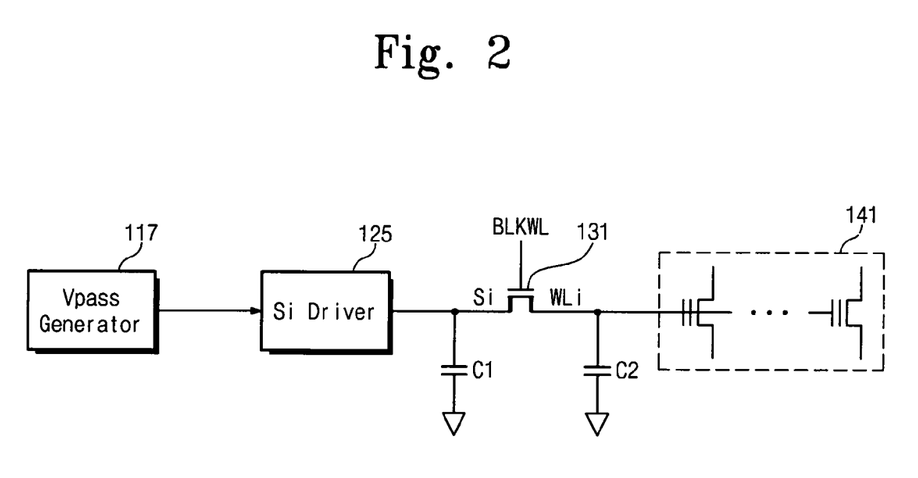
FIG. 2 illustrates an example of the pass voltage generator, word line driver, drive line, switch transistor, word line, and memory cells of FIG. 1.

FIG. 2 illustrates an example of the pass voltage generator 117, word line driver 125, drive line Si, switch transistor 131, word line WLi, and memory cells 141 of FIG. 1. Capacitance C1 illustrates a parasitic capacitance of the drive line Si, and capacitance C2 illustrates a parasitic capacitance of the word line WLi.

A word line driving method is described below, with reference to FIG. 2. In a first word line driving method, a block select signal BLKWL is driven with a high voltage Vpp so as to supply a pass voltage Vpass to the word line WLi. This causes the drive line Si and the word line WLi to be electrically connected via the switch transistor 131. Under this condition, the drive line Si is driven with the pass voltage Vpass by the word line driver 125. According to this driving method, the pass voltage generator 117 can charge the drive line Si and the word line WLi simultaneously.

In a second word line driving method, the drive line Si is charged to the pass voltage Vpass by the pass voltage generator 117 and the word line driver 125. Then the block select signal BLKWL is activated to supply the pass voltage Vpass to the word line WLi. This leads to electrically connect the drive line Si and the word line WLi via the switch transistor 131. When the drive line Si and the word line WLi become electrically connected, the voltage decreases as the capacitance of the word line WLi is charged. In an embodiment, the word line driving method includes pre-charging the driving line Si to a higher level than the pass voltage Vpass. As a result, the pass voltage Vpass can be maintained even when the voltage decreases due to charge sharing between the drive line Si and word line WLi.

Figure 3:
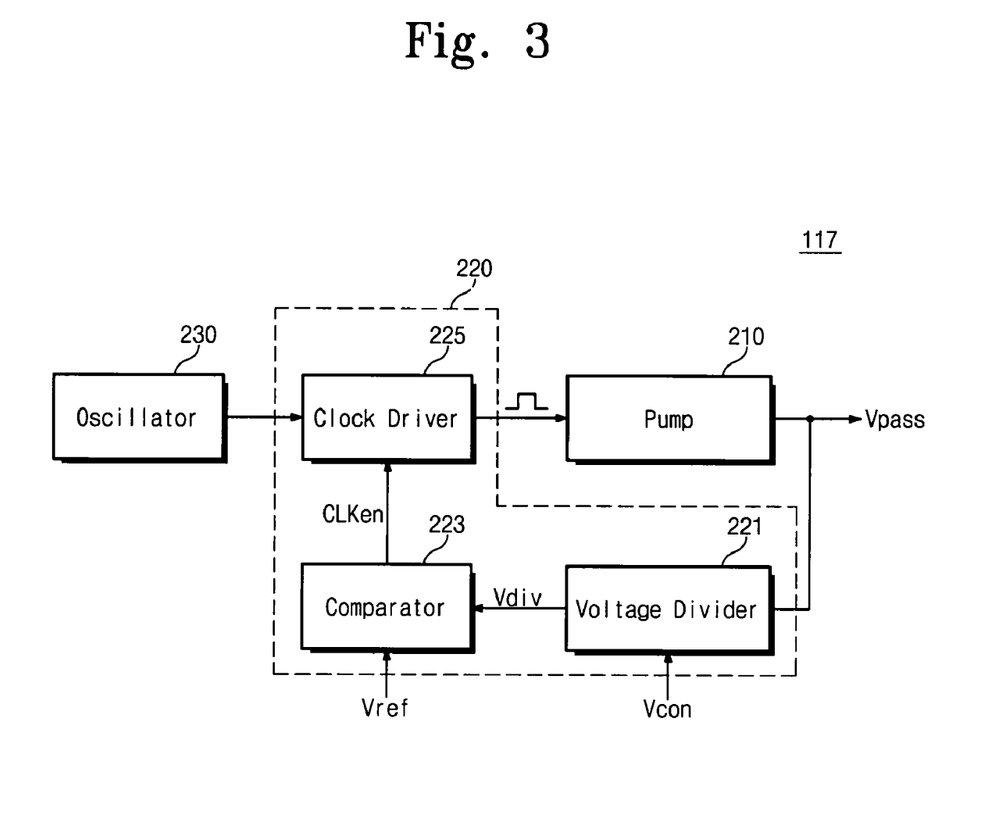
FIG. 3 is a block diagram illustrating an example of the pass voltage generator of FIG. 1.

FIG. 3 is a block diagram illustrating an example of the pass voltage generator of FIG. 1. Referring to FIG. 3, the pass voltage generator 117 includes a pump 210, a regulator 220, and an oscillator 230. The regulator 220 includes a voltage divider 221, a comparator 223 and a clock driver 225. The regulator 220 is configured so that the output voltage may be maintained consistently.

The pump 210 is configured to generate a pass voltage Vpass in response to a clock signal from the clock driver 225. The voltage divider 221 is configured to receive an output voltage of the pump 210, i.e. the pass voltage Vpass, and divide the pass voltage Vpass in response to a voltage control signal Vcon. The divided voltage Vdiv is provided to the comparator 223. The voltage divider 221 will be described in detail below with reference to the drawings.

The comparator 223 is configured to compare the divided voltage Vdiv from the voltage divider 221 and the reference voltage Vref, and as a result, generate a clock enable signal CLKen. For example, when the divided voltage from the voltage divider 221 is lower than the reference voltage Vref, the comparator 223 activates the clock enable signal CLKen.

The clock driver 225 is configured to output the oscillation signal from the oscillator 230 as a clock signal, in response to the clock enable signal CLKen. For example, the clock driver 225 is configured to output the oscillation signal as the clock signal when the clock enable signal CLKen is activated. In an embodiment, the pump 210 is configured to operate to increase the output voltage as high as the target voltage. When the clock enable signal CLKen is deactivated, the oscillation signal is blocked and the clock signal is not outputted. This implies that the pump 210 is not operated.

Figure 4:
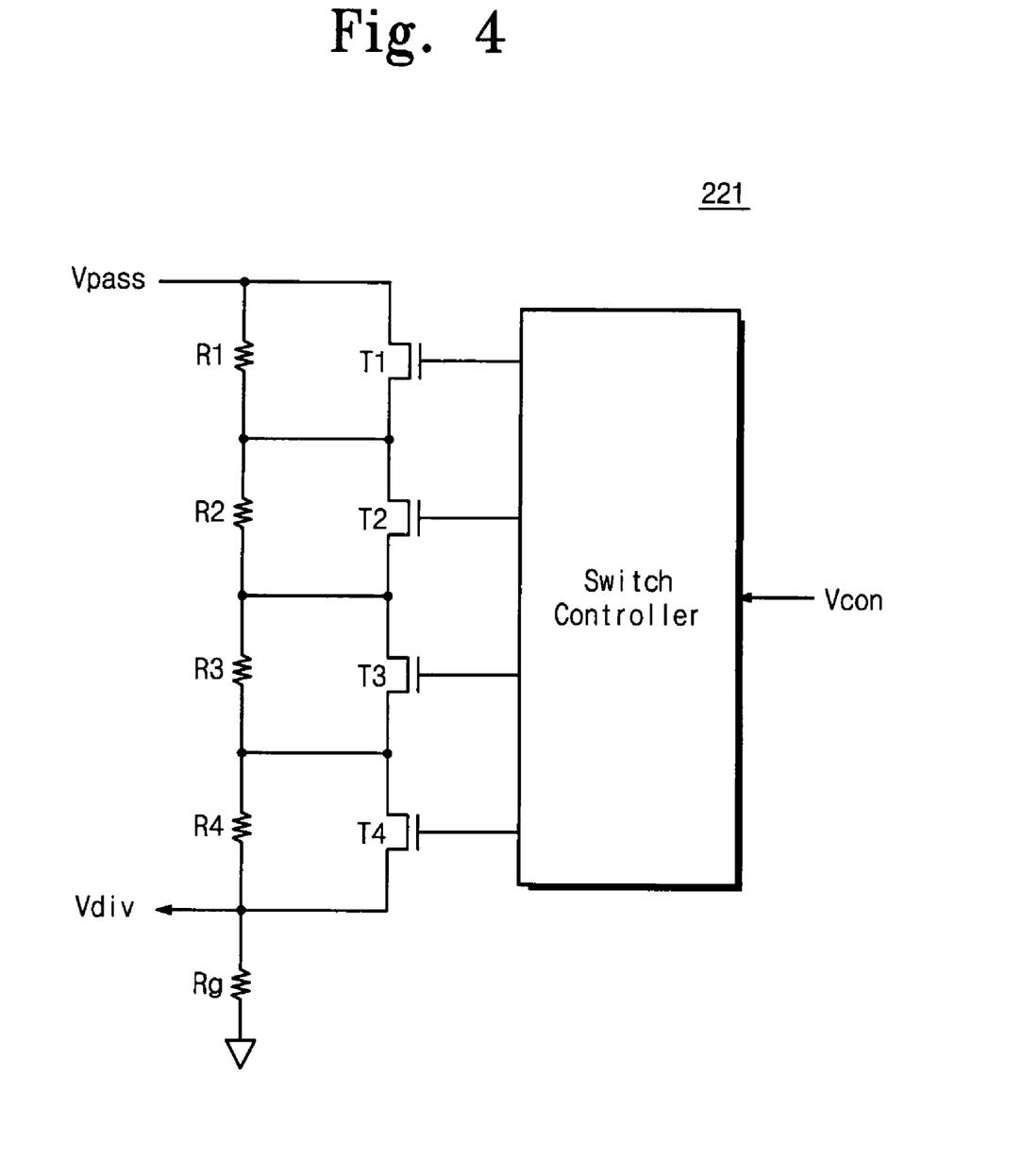
FIG. 4 is a circuit diagram illustrating an example of the voltage divider of FIG. 3.

FIG. 4 is a circuit diagram illustrating an example of the voltage divider of FIG. 3. Referring to FIG. 4, the voltage divider 221 is configured to receive the pass voltage Vpass and outputs the divided voltage Vdiv. A plurality of resistors R1-R4 are connected in series between the pass voltage node Vpass node and the divided voltage node Vdiv. Transistors T1-T4 are connected in parallel to the resistors R1-R4, respectively. The resistance values of the resistors R1-R4 may be equal or different from each other. Although the voltage divider 221 has been described as including four resistors R1-R4 and four transistors T1-T4, other embodiments can include more or less resistors, transistors, different pairing of resistors and transistors, or the like.

A total resistance value of the resistors R1-R4 designated between the pass voltage Vpass and the divided voltage Vdiv may vary in response to the voltage control signal Vcon. The switch control circuit controls the transistors T1-T4 in response to the voltage control signal Vcon. The switch control circuit designates a predetermined resistance value so that a predetermined divided voltage Vdiv may be output in response to the voltage control signal Vcon from a control logic (not shown).

Figure 5:
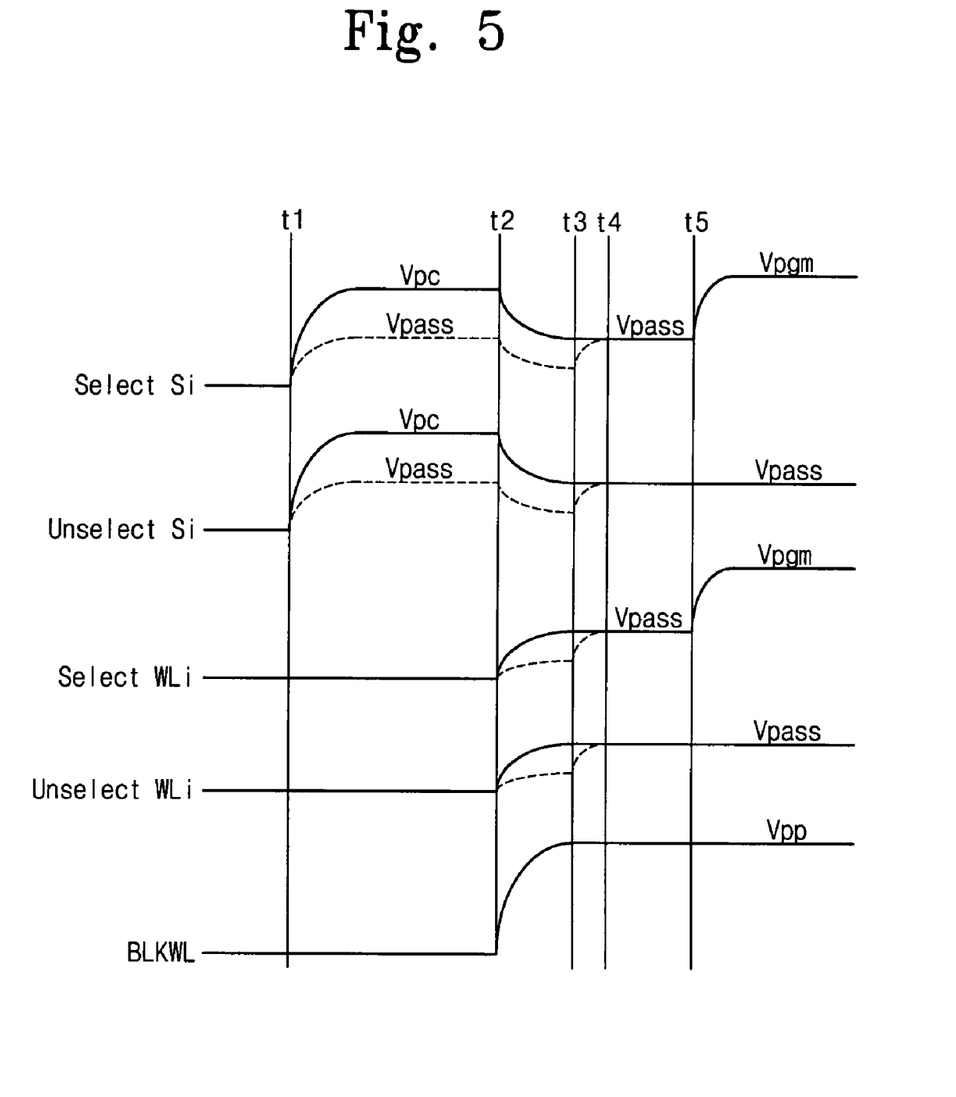
FIG. 5 is an operation timing diagram illustrating a word line driving method of the flash memory device according to an embodiment.

FIG. 5 is an operation timing diagram illustrating a word line driving method of the flash memory device according to an embodiment. Solid lines show variation in the word line voltages according to an embodiment, and dotted lines show variation in word line voltages according to a conventional method. In an embodiment, a program operation of the flash memory device is described below. However, embodiments are not limited to only flash memory devices. For example, the method of supplying word line voltages according to an embodiment may be applied to read and verify read operations of a variety of devices.

Referring to a word line voltage variation according to a conventional method, the voltages of the selected drive line Si and the unselected drive lines Si start to increase up to the pass voltage Vpass, at time point t1. At time point t2, the drive line Si and the word line WLi are electrically connected when the block select signal BLKWL is enabled. Accordingly, voltages of the drive line Si and the word line WLi decrease due to charge sharing. At time point t3, the pump is configured to operate to increase the word line voltage up to the pass voltage. At time point t4, the voltages of the word lines WLi reach the pass voltage Vpass. At time point t5, a program voltage is supplied to the selected word line WLi.

In contrast, in an embodiment, the voltages of the selected drive line Si and the unselected drive lines Si increase up to the precharge voltage Vpc, at time point t1. Here, the precharge voltage Vpc may be higher than the pass voltage Vpass. At time point t2, the drive line Si and the word line WLi are electrically connected when the block select signal BLKWL is enabled. Accordingly, voltages of the drive line Si and the word line WLi decrease to the pass voltage Vpass by charge sharing. Accordingly, the pumping operation is not required to increase the word line voltage up to the pass voltage. Even when a voltage of the word line WLi decreases under the pass voltage Vpass, the voltage of the word line WLi may be rapidly increased up to the pass voltage Vpass as the decrease will be less than if the drive line Si was only charged to the pass voltage Vpass.

As described above, the drive line Si is charged to the precharge voltage Vpc that is higher than the pass voltage Vpass, before the drive line Si and the word line WLi are electrically connected. Accordingly, even in case the drive line Si and the word line WLi are electrically connected, a voltage of the word line WLi is decreased to a level which is approximately equal to the pass voltage Vpass.

In an embodiment, the precharge voltage Vpc can be determined with reference to the equivalent capacitance of the drive line Si, equivalent capacitance of the word line WLi, and the pass voltage Vpass. For example, assuming that the equivalent capacitance of the drive line Si is C1, the equivalent capacitance of the word line WLi is C2, and the precharge voltage is Vpc, the drive line Si is charged to Vpc before the drive line Si and the word line WLi are connected. Here, the charged amount of electric charge is C1*Vpc. Assuming that the voltage after the drive line Si and the word line WLi are connected is Vpass, the total amount of charge becomes (C1+C2)*Vpass, after the drive line Si and the word line WLi are connected. Here, the total amount of charge before and after the connections may be substantially equal, according to the Conservation Law of Electrical Charge. Equation 1 illustrates the conservation of charge.

$$C1 \cdot Vpc = (C1+C2) \cdot Vpass \qquad (1)$$

Equation 1 can be solved for V2, resulting in Equation 2.

$$Vpc = \frac{(C1 + C2)}{C1} \cdot Vpass \qquad (2)$$

Therefore, the precharge voltage Vpc may be determined with reference to the equivalent capacitances C1 and C2 and the pass voltage Vpass. Although an example of an i-th drive line Si capacitance C1 and an i-th word line WLi capacitance C2 has been given, the capacitances of such drive lines and word lines can, but need not be equivalent. Accordingly, the precharge voltage Vpc can be calculated taking into account the variety of the drive line Si capacitances and the word line WLi capacitances.

Figure 6:
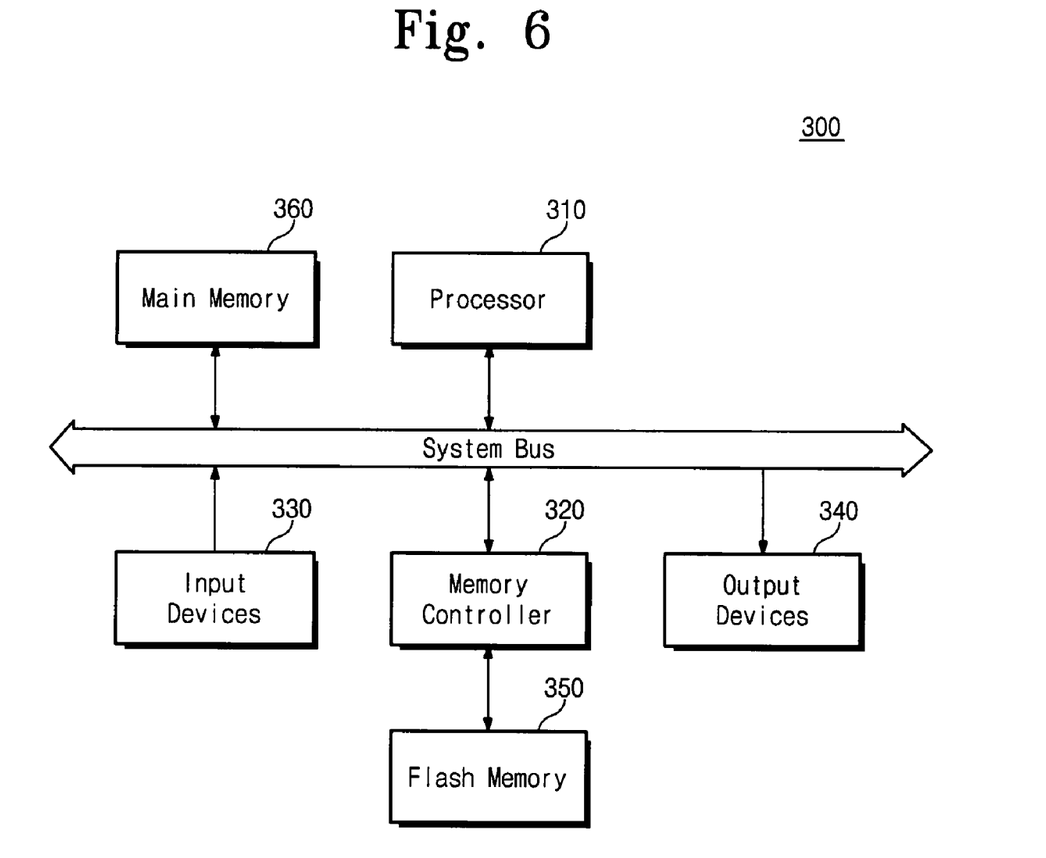
FIG. 6 is a schematic block diagram illustrating a computing system including the flash memory device according to an embodiment.

FIG. 6 is a schematic block diagram illustrating a computing system 300 including the flash memory device according to an embodiment. Referring to FIG. 6, the computing system 300 includes a processor 310, a memory controller 320, input devices 330, output devices 340, a flash memory 350 and a main memory 360. The solid lines illustrate a system bus through which data, commands, or the like are transferred.

In an embodiment, the memory controller 320 and the flash memory device 350 may constitute a memory card. And the processor 310, input devices 330, output devices 340, and main memory 360 may constitute a host configured to use the memory card as the memory device.

The computing system 300 is configured to receive data from external source via the input devices 330 (e.g. keyboard, camera). For example, the inputted data may be a command from user or multi-media data, such as image data from camera. The inputted data can be stored in the flash memory 350 or the main memory 360.

The result processed by the processor 310 is stored in the flash memory 350 or the main memory 360. The output devices 340 output data stored in the memory 350 or the main memory 360. The output devices 340 output visible digital data, audio digital data, or the like. For example, the output devices 340 include displays, speakers, or the like.

In an embodiment, the word line driving method according to may be applied to the flash memory 350. The operation speed of the computing system 300 may increase in proportion to the increase of the operation speed of the flash memory 350.

In an embodiment, the flash memory 350 and/or the memory controller 320 may be mounted using various forms of packages. The flash memory 350 and/or the controller 320 may be mounted using packages, for example, Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

In an embodiment, the semiconductor memory system can be part of a Solid State Drive (SSD). Recently, the SSD products are becoming popular in the next generation memory market as they are expected to replace the Hard Disk Drive (HDD). The SSD products are faster and durable against external impact, and consume less power compared to the Hard Disk Drive. In an embodiment, the semiconductor memory system can be used as a mobile storage device. For example, an embodiment can be storage devices of an MP3 device, a digital camera, a PDA, an e-Book, or the like. An embodiment can be a storage device of a digital TV, a computer, or the like.

Although embodiments have been described in connection with the accompanying drawings, embodiments are not limited thereto. Persons with skill in the art will recognize that embodiments may be applied to other types of memory devices. The above-disclosed subject matter is to be considered illustrative, and not restrictive, and the appended claims are intended to cover all such modifications, enhancements, and other embodiments, which fall within the true spirit and scope of the following claims. Thus, to the maximum extent allowed by law, the scope of the following claims is to be determined by the broadest permissible interpretation and their equivalents, and shall not be restricted or limited by the foregoing detailed description.

What is claimed is:

1. A nonvolatile memory device comprising:
   a memory cell;
   a word line coupled to the memory cell;
   a drive line;
   a switch coupled between the word line and the drive line, and configured to electrically connect the word line and the drive line; and
   a voltage generator coupled to the drive line and configured to charge the drive line to a precharge voltage;
   wherein the precharge voltage is higher than a bias voltage applied to the word line during a corresponding operation on the memory cell, and
   wherein the precharge voltage is based on a capacitance of the drive line, a capacitance of the word line, and the bias voltage.

2. The nonvolatile memory device of claim 1, further comprising a control logic circuit coupled to the voltage generator and configured to cause the voltage generator to charge the drive line to the precharge voltage before the drive line is electrically connected to the word line by the switch.

3. The nonvolatile memory device of claim 2, wherein the control logic circuit is further configured to cause the voltage generator to further charge the drive line after the drive line is electrically connected to the word line to charge the word line to the bias voltage.

4. The nonvolatile memory device of claim 2, wherein the switch comprises a transistor including a source coupled to the drive line, a drain coupled to the word line, and a gate configured to receive a block select signal from a block select driver.

5. The nonvolatile memory device of claim 4, wherein the control logic circuit is configured to activate the block select signal after the drive line is charged to the precharge voltage.

6. The nonvolatile memory device of claim 1, wherein the precharge voltage is substantially equal to the bias voltage multiplied by a sum of the capacitance of the drive line and the capacitance of the word line and divided by the capacitance of the drive line.

7. A computing system, comprising:
   a nonvolatile memory device; and
   a host using the nonvolatile memory device as a memory device, wherein the nonvolatile memory device is as disclosed in claim 1.

8. A method of driving a word line of a nonvolatile memory device, comprising:
   charging a drive line to a precharge voltage;
   electrically connecting the drive line to a word line coupled to a memory cell after charging the drive line to the precharge voltage; and
   charging the word line to a bias voltage for an operation of the memory cell;
   wherein the bias voltage is less than the precharge voltage, and
   wherein the precharge voltage is based on a capacitance of the drive line, a capacitance of the word line, and the bias voltage.

9. The method of claim 8, wherein charging the word line to the bias voltage for the operation of the memory cell comprises transferring charge from the drive line to the word line.

10. The method of claim 9, wherein:
    transferring charge from the drive line to the word line charges the word line to an voltage less than or equal to the bias voltage; and
    charging the word line to the bias voltage for the operation of the memory cell further comprises driving the drive line while the drive line and the word line are electrically connected until the word line is charged to a voltage substantially equal to the bias voltage.

11. The method of claim 9, wherein electrically connecting the drive line to the word line comprises:
    generating a block select signal; and
    switching a switch coupled between the drive line and the word line in response to the block select signal.

12. The method of claim 8, wherein the bias voltage is a pass voltage and the precharge voltage is a voltage higher than the pass voltage.

13. The method of claim 8, wherein the precharge voltage is substantially equal to the bias voltage multiplied by a sum of the capacitance of the drive line and the capacitance of the word line and divided by the capacitance of the drive line.

14. A nonvolatile memory device comprising:
    a memory cell array including a plurality of memory cell strings, each memory cell string including a plurality of memory cells;
    a plurality of word lines coupled to the memory cells of the memory cell array;
    a plurality of drive lines;

a pass gate coupled between the word lines and the drive lines, and configured to electrically connect the drive lines and word lines;

a high voltage generator configured to generate a plurality of high voltages;

a driver circuit coupled between the high voltage generator and the drive lines, and configured to provide at least one of the high voltages to the drive lines; and a control logic circuit configured to cause the high voltage generator to charge the drive lines through the driver circuit to a precharge voltage before the pass gate electrically couples the word lines and the drive lines;

wherein the precharge voltage is greater than a bias voltage for an operation on the memory cells, and wherein the precharge voltage is based on a capacitance of the drive lines, a capacitance of the word lines, and the bias voltage.

15. The nonvolatile memory device of claim 14, wherein the driver circuit is configured to apply a high voltage from the high voltage generator as a block select signal to the pass gate.

16. The nonvolatile memory device of claim 15, wherein:

the pass gate includes a plurality of transistors, each transistor coupled between a corresponding word line of the word lines and a corresponding drive line of the drive lines; and each transistor is responsive to the block select signal.

17. The nonvolatile memory device of claim 15, wherein the control logic circuit is configured to cause the high voltage generator to charge the drive lines through the driver circuit to the precharge voltage before causing the driver circuit to activate the block select signal.

18. The nonvolatile memory device of claim 17, wherein the control logic circuit is configured to cause the high voltage generator to continue charging the drive lines through the driver circuit after causing the driver circuit to activate the block select signal until a voltage on the word lines is substantially equal to a pass voltage.

* * * * *